United States Patent [19]

Whiting et al.

[11] Patent Number: 5,003,307
[45] Date of Patent: Mar. 26, 1991

[54] DATA COMPRESSION APPARATUS WITH SHIFT REGISTER SEARCH MEANS

[75] Inventors: Douglas L. Whiting, South Pasadena; Glen A. George, Pasadena, both of Calif.

[73] Assignee: Stac, Inc., Pasadena, Calif.

[21] Appl. No.: 418,034

[22] Filed: Oct. 6, 1989

Related U.S. Application Data

[63] Continuation-in-part of Ser. No. 297,152, Jan. 13, 1989, Pat. No. 4,841,092.

[51] Int. Cl.$^5$ .............................................. H03M 7/42
[52] U.S. Cl. ........................................ 341/51; 341/67; 341/106
[58] Field of Search ................. 341/51, 67, 63, 76, 341/106, 95; 375/27; 358/261.1; 364/200, 900

[56] References Cited

U.S. PATENT DOCUMENTS

| | | | |
|---|---|---|---|
| 3,976,844 | 8/1976 | Betz | 375/122 |
| 4,021,782 | 5/1977 | Hoerning | 341/51 X |
| 4,054,951 | 10/1977 | Jackson et al. | 364/900 |
| 4,412,230 | 10/1983 | Moll | 364/900 |
| 4,463,422 | 7/1984 | Storer et al. | 364/200 |
| 4,464,650 | 8/1984 | Eastman et al. | 341/51 |
| 4,491,934 | 1/1985 | Heinz | 364/900 |
| 4,538,240 | 8/1985 | Carter et al. | 364/754 |
| 4,558,302 | 12/1985 | Welch | 341/51 |
| 4,588,985 | 5/1986 | Carter et al. | 341/95 |
| 4,612,532 | 9/1986 | Bacon et al. | 341/90 X |
| 4,701,745 | 10/1987 | Waterworth | 341/63 |
| 4,814,746 | 3/1989 | Miller et al. | 341/95 |
| 4,876,541 | 10/1989 | Storer | 341/67 X |

OTHER PUBLICATIONS

E. U. Cohler and J. E. Storer, "Functionally Parallel Architecture For Array Processors," *IEEE Computer*, vol. 14, No. 9, Sep., 1981.

J. Rissanen, "A Universal Data Compression System," *IEEE Transactions on Information Theory*, vol. IT-29, No. 5, Sep., 1983, pp. 656–664.

J. H. Reif and J. A. Storer, "Real-Time Dynamic Compression of Video on a Grid-Connected Parallel Computer," *Third International Conference on Supercomputing*, May 15–20, 1988, pp. 453–462.

J. Cleary et al., "Data Compression Using Adaptive Coding and Partial String Matching", *IEEE Transactions on Communications* 32:396–403 (1984).

D. L. Dance et al., "An Adaptive on Line Data Compression System,", *The Computer Journal;* 19:216–224 (1976).

M. Wells, "File Compression Using Variable Length Encodings," *The Computer Journal;* 15:308–313 (1972).

M. E. Gonzalez Smith et al., "Parallel Algorithms for Data Compression," *Journal of the Association for Computing Machinery;* 32:344–373 (1985).

*Primary Examiner*—A. D. Pellinen
*Assistant Examiner*—Sharon D. Logan
*Attorney, Agent, or Firm*—Irell & Manella

[57] ABSTRACT

An apparatus and method are disclosed for converting an input data character stream into a variable length encoded data stream in a data compression system. The data compression system includes a shift register means. The shift register means has a plurality of entries and each entry of the shift register means is for storing a data character of the input data stream. The method for converting the input data character stream includes the following steps. Performing a search in the shift register means for a data string which matches the input data string. The step for performing the search includes the steps of broadcasting each input data character of the input data stream to each entry of the shift register means and comparing each input data character simultaneously with the previously stored contents of each entry of said shift register means. If the matching data string is found within the shift register means, the next step includes encoding the longest matching data string by appending to the encoded data stream a tag indicating the matching data string and a string substitution code. If the matching data string is not found within the shift register means, the next step includes encoding the first character of the input data string by appending to the encoded data stream a raw data tag and the first character of the input data string.

60 Claims, 5 Drawing Sheets

19 ⟶ 0bbbbbbbb = unencoded ("raw") 8-bit byte bbbbbbbb

21 ⟶ 1⟨entry location⟩⟨length⟩ = string at entry location in shift register of given length

23 ⟶ Entry location encoding (location with the shift register means):
⟨entry location⟩ = 1 0000000 = 7-bit (short) offset 1..127 bytes
0 ooooooooooo = 11-bit (long) offset 1..2047 bytes 25 ⟶ String length encoding table:

| ⟨length⟩ = | | | | |
|---|---|---|---|---|
| 00 | | | | = 2 bytes ~ 22 |
| 01 | | | | = 3 bytes ~ 24 |
| 10 | | | | = 4 bytes ~ 26 |
| 11 | 00 | | | = 5 bytes ~ 28 |
| 11 | 01 | | | = 6 bytes ~ 30 |
| 11 | 10 | | | = 7 bytes ~ 32 |
| 11 | 11 | 0000 | | = 8 bytes ~ 34 |
| 11 | 11 | 0001 | | = 9 bytes ~ 36 |
| 11 | 11 | 0010 | | = 10 bytes ~ 38 |
| 11 | 11 | 0011 | | = 11 bytes ~ 40 |
| 11 | 11 | 0100 | | = 12 bytes ~ 42 |
| 11 | 11 | 0101 | | = 13 bytes ~ 44 |
| 11 | 11 | 0110 | | = 14 bytes ~ 46 |
| 11 | 11 | 0111 | | = 15 bytes ~ 48 |
| 11 | 11 | 1000 | | = 16 bytes ~ 50 |
| 11 | 11 | 1001 | | = 17 bytes ~ 52 |
| 11 | 11 | 1010 | | = 18 bytes ~ 54 |
| 11 | 11 | 1011 | | = 19 bytes ~ 56 |
| 11 | 11 | 1100 | | = 20 bytes ~ 58 |
| 11 | 11 | 1101 | | = 21 bytes ~ 60 |
| 11 | 11 | 1110 | | = 22 bytes ~ 62 |
| 11 | 11 | 1111 | 0000 | = 23 bytes ~ 64 |
| 11 | 11 | 1111 | 0001 | = 24 bytes ~ 66 |
| 11 | 11 | 1111 | 0010 | = 25 bytes ~ 68 |
| ... | | | | .... |
| 11 | 11 | 1111 | 1110 | = 37 bytes ~ 70 |
| 11 | 11 | 1111 | 1111 0000 | = 38 bytes ~ 72 |
| 11 | 11 | 1111 | 1111 0001 | = 39 bytes ~ 74 |
| etc. | | | | |

FIG. 3.

| Input byte stream (75) | Output bit stream (77) | Comment (79) |
|---|---|---|
| ┌──>─A | 0 aaaaaaaa | Raw byte A ~ 76 |
| │    B | 0 bbbbbbbb | Raw byte B ~ 78 |
| │ ┌─>A | 0 aaaaaaaa | Raw byte A ~ 80 |
| │ ┌─<─A | 1 1 0000001 1100 | String of length 5 at offset 1 (82) |
| │    A | encode short offset length | |
| │    A | | |
| │    A | | |
| │    A | | |
| │    C | 0 cccccccc | Raw byte C ~ 84 |
| └──<──A | 1 1 0001001 01 | String of length 3 at offset 9 (86) |
|      B | | |
|      A | | |

FIG.5.

INPUT DATA STREAM -- abcd
Entries 1-6 of shift registers 102

| | | | | | | Broadcast byte |
|---|---|---|---|---|---|---|
| a | b | f | a | b | c | a |
| 6 | 5 | 4 | 3 | 2 | 1 | |
| 1 | 0 | 0 | 1 | 0 | 0 | MATCH? |

| b | f | a | b | c | a | b |
|---|---|---|---|---|---|---|
| 6 | 5 | 4 | 3 | 2 | 1 | |
| 1 | 0 | 0 | 1 | 0 | 0 | MATCH? |

| f | a | b | c | a | b | c |
|---|---|---|---|---|---|---|
| 6 | 5 | 4 | 3 | 2 | 1 | |
| 0 | 0 | 0 | 1 | 0 | 0 | MATCH? |

| a | b | c | a | b | c | d |
|---|---|---|---|---|---|---|
| 6 | 5 | 4 | 3 | 2 | 1 | |
| 0 | 0 | 0 | 0 | 0 | 0 | MATCH? |

DATA COMPRESSION APPARATUS WITH SHIFT REGISTER SEARCH MEANS

RELATED PATENT APPLICATIONS

The following patent application is a continuation-in part application of U.S. Pat. Application entitled "Data Compression Apparatus and Method" to Doug Whiting, Ph.D., having U.S. Ser. No. 297,152, and filed on Jan. 13, 1989 now U.S. Pat. No. 4,841,092. The entire disclosure of the U.S. Pat. application No. 297,152 is hereby incorporated by reference.

FIELD OF THE INVENTION

The present invention relates generally to data storage and communication systems, and more particularly to data compression systems and methods which improve the capacity of data storage and communication.

DESCRIPTION OF THE PRIOR ART

Due to the insignificant differences between data compression in data storage and data communication systems, only data storage systems are referred to; particularly the data files stored in such systems. However, all data storage systems can easily be extended to cover data communications systems and other applications as well. A file is assumed to be a sequential stream of bytes or characters, where a byte consists of some fixed number of bits (typically 8), and the compression system transforms this input byte stream into a "compressed" output stream of bytes from which the original file contents can be reconstructed by a decompression unit.

It is well-established that computer data files typically contain a significant amount of redundancy. Many techniques have been applied over the years to "compress" these files so that they will occupy less space on the disk or tape storage medium or so that they can be transmitted in less time over a communications channel such as a 1200 baud modem line. For example, there are several widely used commercial programs available for personal computers (e.g., ARC Software by Systems Enhancement Associates, Inc., Wayne, N.J., 1985) which perform the compression and decompression functions on files. It is not uncommon for such programs to reduce the size of a given file by a 2:1 ratio (or better), although the amount of reduction varies widely depending on the contents of the file.

There are many approaches in the prior art for compressing data. Some of these approaches make implicit assumptions about certain types of files or data within the files. For example, a bit image of a page produced using a scanner typically has most of its pixels blank, and this tendency can be exploited by a compression algorithm to greatly reduce the size of such files. Similarly, word processing files contain many ASCII characters which are easily compressed using knowledge of which characters (or words) occur most frequently in the language of interest (e.g., English). Other compression methods are independent of the file type and attempt to "adapt" themselves to the data. In general, type-specific compression techniques may provide higher compression performance than general-purpose algorithms on the file for which the techniques are optimized, however they tend to have much lower compression performance if the file model is not correct. For instance, a compression method optimized for English text might work poorly on files containing French text.

Typically, a storage system does not "know" what type of data is stored within it. Thus, data-specific compression techniques are avoided, or they are only used as one of a set of possible techniques. For example, ARC uses many methods and picks the one that performs best for each file; note however that this approach requires significant computational overhead compared to using a single compression method.

Another important aspect of any compression method is the speed at which a file can be processed. If the speed of compression (or decompression) is so low as to significantly degrade system performance, then the compression method is unacceptable even though it may achieve higher compression ratios than competing methods. For example, with streaming tape systems, if the file cannot be compressed fast enough to provide data at the required rate for the tape drive, the tape will fall out of streaming and the performance and/or capacity gains due to compression will be nullified.

One of the most common compression techniques is known as run-length encoding. This approach takes advantage of the fact that files often have repeated strings of the same byte (character), such as zero or the space character. Such strings are encoded using an "escape" character, followed by the repeat count, followed by the character to be repeated. All other characters which do not occur in runs are encoded by placing them as "plain text" into the output stream. The escape character is chosen to be a seldom used byte, and its occurrence in the input stream is encoded as a run of length one with the escape character itself as the character. Run-length encoding performs well on certain types of files, but can have poor compression ratios if the file does not have repeated characters (or if the escape character occurs frequently in the file). Thus, the selection of the escape character in general requires an extra pass on the data to find the least used byte, lowering the throughput of such a system.

A more sophisticated approach is known as Huffman encoding (see, Huffman, David A., "A Method for the Construction of Minimum-Redundancy Codes", Proceedings of the IRE, pp. 1098-1110, Sept. 1952). In this method, it is assumed that certain bytes occur more frequently in the file than others. For example, in English text the letter "t" or "T" is much more frequent than the letter "Q". Each byte is assigned a bit string, the length of which is inversely related to the relative frequency of that byte in the file. These bit strings are chosen to be uniquely decodeable if processed one bit at a time. Huffman derived an algorithm for optimally assigning the bit strings based on relative frequency statistics for the file.

The Huffman algorithm guarantees that asymptotically the compression achieved will approach the "entropy" of the file, which is precisely defined as, $$H = \text{SUM} - [p(i) \log 2(p(i))];$$

where $p(i)$ = probability of character i within the file

= (# occurrences of i)/(total # characters in file).

The units of H are in bits, and it measures how many bits (on the average) are required to represent a character in the file. For example, if the entropy were 4.0 bits using an 8-bit byte, a Huffman compression system could achieve 2:1 compression on the file. The higher the entropy, the more "random" (and thus less compressible) is the data.

Huffman encoding works very well on many types of files. However, assignment of bit strings to bytes presents many practical difficulties. For example, if a pre-assigned encoding scheme is used (e.g., based on frequency of occurrence of letters in English), Huffman encoding may greatly expand a file if the pre-assigned scheme assumes considerably different frequency statistics than are actually present in the file. Additionally, computing the encoding scheme based on the file contents not only requires two passes over the data as well as applying the Huffman algorithm to the frequency statistics (thus lowering system throughput), but it also requires that the encoding table be stored along with the data, which has a negative impact on the compression ratio. Furthermore, the relative frequency of bytes can easily change dynamically within the file, so that at any point the particular encoding assignment may perform poorly.

There have been many variations on the Huffman approach (e.g., Jones, Douglas W., "Application of Splay Trees to Data Compression", Communications of the ACM, pp. 996–1007, Vol. 31, No. 8, August 1988) and they usually involve dynamic code assignment based on the recent history of input bytes processed. Such schemes circumvent the problems discussed above. Other approaches include looking at two byte words (bi-grams) at the same time and performing Huffman encoding on the words.

A recent variation of Huffman encoding is present in U.S. Pat. No. 4,730,348 to MacCrisken (and other patents referenced therein). In MacCrisken, Huffman codes are assigned to bytes in the context of the previous byte. In other words, a plurality of encoding tables are used, each table being selected according to the previous byte. This approach is based on the observation that, for example, in English the letter "u" does not occur very frequently, but following a "q" it appears almost always. Thus, the code assigned to "u" would be different depending on whether or not the previous letter was "q" (or "Q"). For a similar scheme using multiple tables and dynamic code assignment see, Jones, Douglas W., "Application of Splay Trees to Data Compression".

The above described Huffman-type approaches tend to be computationally intensive and do not achieve exceptionally high compression ratios. One explanation for this observation is that a pure Huffman code based on 8-bit bytes can achieve at best an 8:1 compression ratio, and only in the optimal situation when the file consists of the same byte repeated over and over (i.e. entropy=0). In the same scenario even a simple run-length encoding scheme could achieve better than a 50:1 compression ratio. The average performance will be some combination of best and worst case numbers, and limiting the best case must also limit the average. An ideal Huffman code should be able to use "fractional" bits to optimize code assignment, but the practical limitation of integral numbers of bits in each code limits the Huffman performance to well below its theoretical limit.

A totally different approach to compression was developed by Ziv and Lempel (see, Ziv, J. and Lempel, A., "Compression of Individual Sequences in Variable-Rate Coding", IEEE Transactions on Information Theory, Vol. IT-24, pp. 530–536, September 1978) and then refined by Welch (see, Welch, Terry A., "A Technique for High-Performance Data Compression", IEEE Computer, pp. 8–19, June 1984). Instead of assigning variable length codes to fixed size bytes, the Ziv-Lempel algorithm ("ZL") assigns fixed-length codes to variable size strings. As input bytes from the file are processed, a table of strings is built up, and each byte or string of bytes is compressed by outputting only the index of the string in the table. Typically this index is in the range 11–14 bits, and 12 bits is a common number because it lends itself to a simple implementation. Since the table is constructed using only previously encoded bytes, both the compression and the decompression system can maintain the same table without any extra overhead required to transmit table information. Hashing algorithms are used to find matching strings efficiently. At the start of the file, the table is initialized to one string for each character in the alphabet, thus ensuring that all bytes will be found in at least one string, even if that string only has length one.

The Ziv-Lempel algorithm is particularly attractive because it adapts itself to the data and requires no pre-assigned tables predicated on the file contents. Furthermore, since a string can be extremely long, the best case compression ratio is very high, and in practice ZL out performs Huffman schemes on most file types. It is also quite simple to implement, and this simplicity manifests itself in high throughput rates.

There are also some drawbacks, however, to the ZL compression method. The ZL string search is a "greedy" algorithm. For example, consider the string:

ABCDEFBCDEF;

where A,B,C,D,E,F are any distinct bytes. Note that the ZL string search would add the following strings to its string table: AB, BC, CD, DE, EF, BCD, DEF, the only strings of length two or greater that can be output using this algorithm, up to the point shown, are BC and DE. In actuality the string BCDEF has already occurred in the input. Thus, while ideally the second BCDEF string would be referenced back to the original BCDEF, in practice this does not occur.

A more significant disadvantage to the ZL approach is that the string table for holding the compressed data will tend to fill up on long files. The table size could be increased, however, this approach would require more bits to represent a string and thus it would be less efficient. One approach to handling this deficiency would be to discard all or part of the table when it fills. Because of the structure of the algorithm, the most recently found strings have to be discarded first, since they refer back to previous strings. However, it is the most recent strings that have been dynamically adapting to the local data, so discarding them is also inefficient. Basically, the ZL string table has infinite length memory, so changes in the type of data within the file can cause great encoding inefficiencies if the string table is full.

It is also possible to design a compression system that utilizes more than one method simultaneously, dynamically switching back and forth depending on which method is most efficient within the file. From an implementation standpoint, such a scheme may be very costly (i.e., slow and/or expensive), however the resulting compression rate could be very high.

One such method of dynamically switching back and forth is disclosed in MacCrisken. As mentioned above, a bi-gram Huffman method is utilized as the primary compression technique. Typically the compression and decompression system start with a pre-defined (i.e. static) set of code tables. There may be a set of such tables, perhaps one each for English, French, and Pascal source code. The compression unit (sender) first transmits or stores a brief description of which table is to be used. The decompression unit (receiver) interprets this code and selects the appropriate table. During compression, if it is determined that the current table is not performing well, the sender transmits a special ("escape") Huffman code that tells the receiver to either select another specific pre-defined table or to compute a new table based on the previous data it has decompressed. Both sender and receiver compute the table using the same algorithm, so there is no need to send the entire table, although it takes some time to perform the computation. Once the new table is computed, compression proceeds as before. It should be noted that although there is considerable computational overhead, there is no reason why this technique could not be further adapted to a dynamic Huffman scheme.

In addition to the Huffman encoding, MacCrisken uses a secondary string-based compression method. Both sender and receiver maintain a history buffer of the most recently transmitted input bytes. For each new input byte (A), the bi-gram Huffman code is generated, but an attempt is also made to find the string represented by the next three input bytes (ABC) in the history using a hashing scheme. The hash is performed on three byte strings and a doubly-linked hash list is maintained to allow discarding of old entries in the hash list. If a string is found, a special Huffman escape code can be generated to indicate that a string follows, and the length and offset of the string in the history buffer is sent. The offset is encoded in 10 bits, while the length is encoded into 4 bits, representing lengths from 3-18 bytes. Before such a string is sent however, the compression unit generates the Huffman codes for all the bytes in the string and compares the size of the Huffman codes with the size of the string bits. Typically the Huffman string escape code is four bits, so it takes 19 bits to represent a string. The smaller of the two quantities is sent.

Note that the MacCrisken string method avoids the problems of the Ziv-Lempel method in that the string "table" never fills up, since the old entries are discarded by removing them from the hash list. Thus, only the most recent (within 1K bytes) strings occupy the table. Also it is not "greedy" since in principle all matching strings can be found. In practice, a limit on the length of the string search is imposed. Additionally, the MacCriskin method is computationally inefficient because it is effectively performing two compression algorithms at once, and thus the computational overhead is quite high.

SUMMARY OF THE INVENTION

The present invention relates to a compression/decompression system which increases the capacity of digital storage such as a magnetic disk or tape storage device. The compression method is fully adaptive, requiring no pre-initialized encoding tables, and is optimized for byte-oriented character streams, such as computer files. It overcomes many of the difficulties found in the prior art and achieves higher compression ratios at a much higher rate than any previous technique discussed above.

During compression, a shift register arrangement of previously processed bytes is maintained in the compression apparatus. Compression is achieved by locating repeated strings of bytes in the shift register. If no matching string containing the byte currently being examined is found, the byte is appended to the output data stream after a special tag bit to indicate that the byte is "raw" (i.e., not a string). If such a string is found, its length and relative position within the shift register are encoded and appended to the output of the (compressed) data stream. String length and positions are encoded in such a fashion that even two-byte repeated strings result in a compression ratio better than 1:1. In other words, only in the case of a single "raw" byte does data "expansion" occur.

The string length encoding is variable length, and the string position may also be encoded as a variable length field. Thus, the present invention maps variable length input strings to variable length output codes.

The following is a more detailed description of the preferred embodiment of the present invention which includes a method and apparatus for converting an input data character string into a variable length encoded data string. The data compression system comprises a shift register means. The shift register means has a plurality of entries and each entry of the shift register means is for storing a portion of an input data stream. The method of the preferred embodiment comprises the following steps.

The first step includes performing a search in the shift register means for the longest data string which matches the input data stream. The step for performing the search includes the steps of broadcasting each input data character of the input data stream to each entry of the shift register means and comparing each input data character simultaneously with each entry of said shift register means. If a matching data string is found within the shift register means, the next step includes encoding the matching data string found in the shift register means by appending to the variable length encoded data stream a tag indicating the matching data string and a string substitution code. The string substitution code includes a variable length indicator of the length of the matching data string and a pointer to the location of the entry within the shift register means of the matching data string.

If a matching input data string is not found within the shift register means, the second step includes the step of encoding the first character of the input data stream by appending to the variable length encoded data stream a "raw" data tag which indicates that no matching data string was found in the shift register means and the first character of the input data stream is also appended to the variable length encoded data stream. In this way, the input data stream is converted into a variable length encoded data stream.

The step of performing the search in the shift register means for the longest matching data string may further include the step of limiting the search to a predetermined quantity of input data characters of said input data stream.

Because the structure of the shift register is extremely repetitive, it lends itself very well to an implementation in VLSI. Almost every operation of the shift register array comparison can be pipelined to the maximum clock rate and thus maximize throughput. For example, the priority encoding can be pipelined to as high a degree as necessary to achieve a desired performance. This ability to pipeline is particularly important since the large transistor count required to implement the array may dictate that the array be spread over several integrated circuits.

In the copending application to Dr. Whiting et al., having U.S. Ser. No. 297,152, the preferred embodiment for searching includes a hashing function, which utilizes a hash data structure including a history array pointer, a hash table means and an offset array means. In that embodiment, the history array pointer points to the latest entry in the history array means. The hash table means has a plurality of entries and each entry in the hash table means stores a pointer which points into the history array means. The offset array means has a plurality of entries and each entry provides a link to one of the entries in the history array means.

The steps for performing the hash function include the following steps. First, the result of the hash function is obtained and this result provides a pointer to one of the entries in the hash table means. Then, the pointer stored in the hash table which is pointed to by the result of the hash function is obtained. Next, the difference between the history array pointer and the pointer read from the hash table means is calculated and stored into the offset array entry pointed to by the history array pointer. Lastly, the history array pointer is stored into the hash table entry pointed to by the hash function.

The process of using a hash function is a very efficient method for finding matching strings in general, particularly when the processing apparatus is inherently a sequential computing machine where the performance is limited by the memory bandwidth available. However, the hash data structure discussed above involves a great deal of computation time to maintain the structure for the hashing function. Additionally, since the string match search length is limited, the algorithm for the hashing function may not always find the longest (or any) matching string due to hash collisions.

The preferred embodiment of the present invention includes a shift register means which is utilized for finding matching strings. This embodiment has a much higher throughput than the hashing function embodiment and utilizes available integrated circuit technology to minimize the cost of the circuitry. Additionally, the embodiment guarantees that the maximal length matching string will ALWAYS be found in the shift register array. The preferred embodiment enables the search to be performed in a high speed pipeline fashion. More particularly, the input data character of the input data stream is simultaneously broadcast to each entry of the shift register. The input data character is compared with the stored data character of each entry of the shift register. If the input data character matches any stored data characters within the shift register, then a match result occurs. This process continues for each input data character until the longest matching data string is found. The match results for each entry of the shift register means are accumulated and maintained. Additionally, the entry location of the longest matching string along with the length of the longest matching string are stored. Entry location and length are then encoded to thereby obtain the compression efficiency.

The preferred embodiment of the invention also includes a method for decoding the variable length encoded data stream which is output from the compression unit. The method for decomposition includes the following steps. First, the variable length encoded data stream is parsed into separate portions and each separate portion starts with one of the tags. Next, the tag of each separate portion is evaluated to determine whether the tag is the raw data tag or the tag indicating an encoded matching data string. When the tag indicates that there is an encoded matching data string, the next step includes interpreting the length indicator and the pointer of the substitution code for generating the matching data string. In this way, a portion of the original input data stream is reconstructed. Alternatively, when the tag is a raw data tag, then the first character of the encoded input data stream is obtained and in this way a portion of the original input data stream is reconstructed.

DETAILED DESCRIPTION OF THE PREFERRED EMBODIMENT

Figure 1A:
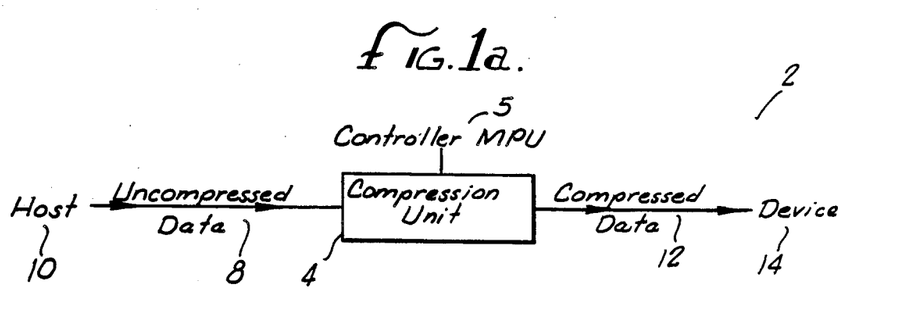
FIG. 1a is a block diagram of a compression unit accepting uncompressed data and outputting compressed data according to the present invention.
Figure 1B:
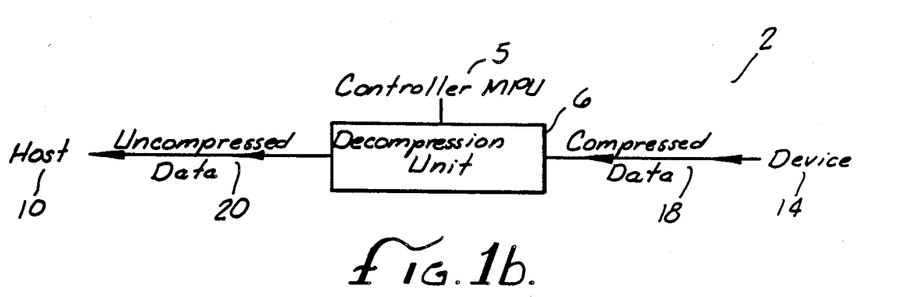
FIG. 1b is a block diagram of a decompression unit accepting compressed data and outputting decompressed data according to the present invention.

Referring to FIGS. 1a and 1b a compression unit 4 and a decompression unit 6 according to the present invention are depicted. Both unit 4 and unit 6 can be hardware modules or software subroutines, but, in the preferred embodiment, the compression Unit 4 and decompression Unit 6 are incorporated into a single integrated circuit. The integrated circuit is used as part of a data storage or data transmission system, which is controlled by a microprocessor 5. Referring to FIG. 1a, an input data stream 8 is received by the compression unit 4 from a data source called the host 10, and the encoded compressed data stream 12 is transmitted to a data sink called the device 14.

Similarly, in FIG. 1b, the decompression unit 6 receives a compressed data stream 18 from the device 14 (which in this case is a data source), reconstructs the original uncompressed data stream 20, and outputs it to the host 10 (which in this case is a data sink). In the preferred embodiment, decompression and compression are not performed simultaneously, however in an alternate embodiment they could be performed at the same time.

Figure 2:
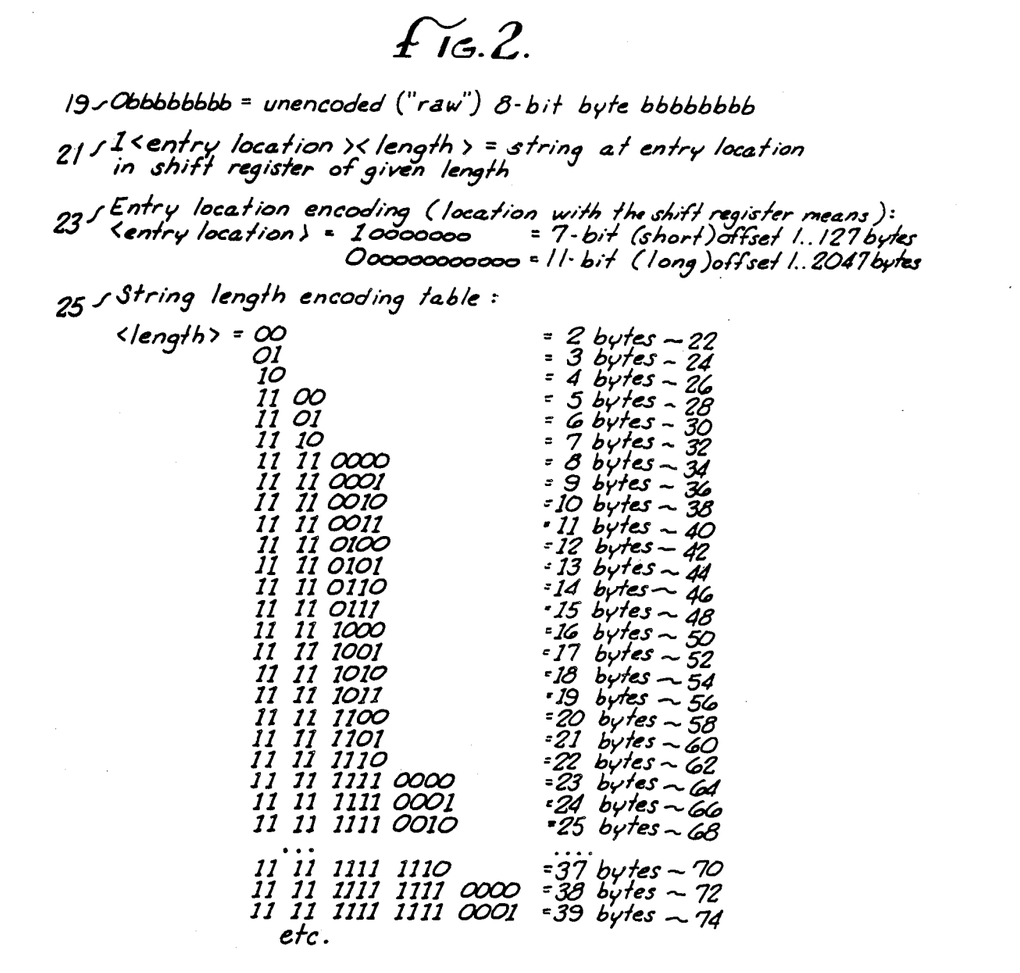
FIG. 2 depicts the compression format used by the preferred embodiment of the present invention.

Referring to FIG. 2, the encoding scheme of the preferred embodiment of the invention is shown. In the preferred embodiment, the method for encoding utilizes a tag bit to indicate whether an output data string is "raw" or uncompressed which is indicated by a "0" bit, 0BBBBBBBB=encoded "raw", 8-bit byte (19, FIG. 2) or compressed indicated by a "1" bit, 1(entry location)-(length)=string at offset back into shift register (21, FIG. 2). In the preferred embodiment, the entry encoding or the location of the entry in the shift register is one of two forms (23, FIG. 2). A short form having 7 bits can create an entry location of 1 to 127 bytes and a long form having 11 bits can create an entry location of 1 to 2,047 bytes. The long and short forms are differentiated by a single bit; "1" designating short form and "0" designating long form. The particular length encoding scheme used by the present invention is shown in Table 25 (FIG. 2). From the top of the Table 25, a 2 byte length is encoded by 2 bits having the values "00" (22, FIG. 2). Likewise, encoded lengths of 3 and 4 bytes are represented respectively by 2 bits having the values "01" (24, FIG. 2) and "10" (26, FIG. 2). Byte lengths of 5 to 7 are represented by 4 bits, "11 00" to "11 10" (28–32, FIG. 2). Byte lengths of 8 to 22 are represented by 8 bits, "11 11 0000" to "11 11 1110" (34–62, FIG. 2). After 22 byte lengths, the next byte lengths between 23 and 37 are represented by 12 bits (64–70, FIG. 2), and so on. The advantage of the length encoding scheme shown in Table 25 is for enabling an efficient procedure for encoding the length of a bit string during the compression method discussed below. Although different methods for encoding length and entry location have been tested, the compression ratios obtained by the above approaches are very similar to the preferred embodiment.

Figure 3:
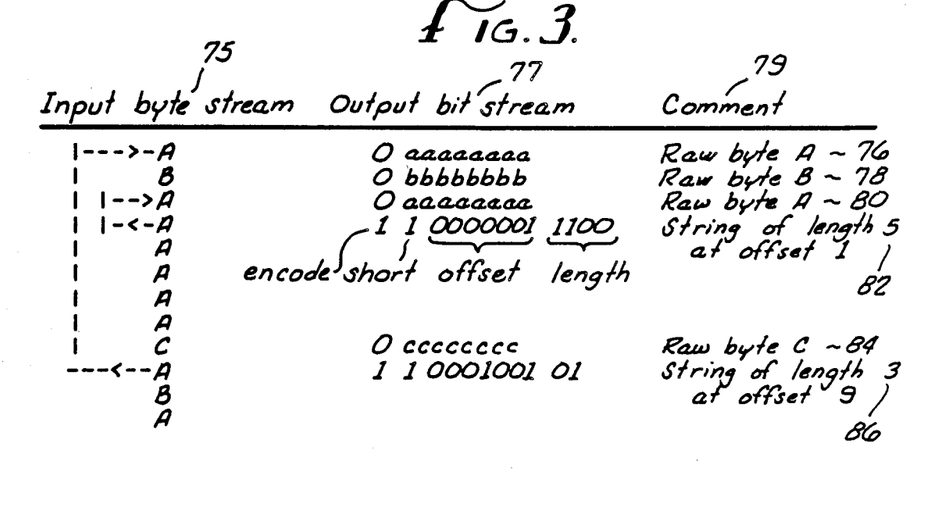
FIG. 3 depicts a simplified example of compression encodings according to the compression format depicted in FIG. 2.
Figure 4:
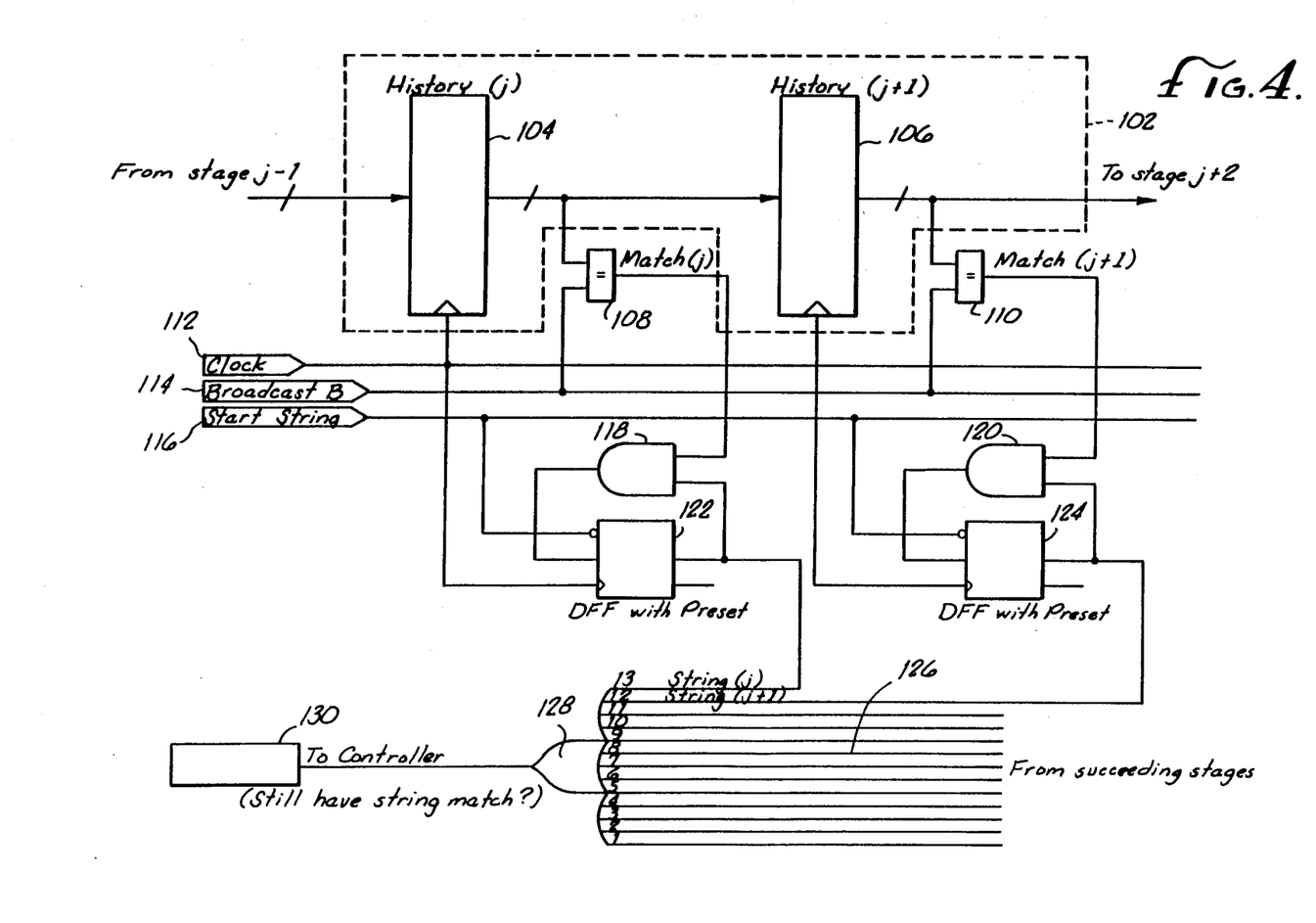
FIG. 4 is a block diagram representation of two entries within the shift register array and associated circuitry for implementing a search function.

FIG. 3 shows a simple results table utilizing the compression scheme shown in FIG. 2. The table is separated into three columns, the first column 75 represents an input byte stream, the second column 77 is the encoded output stream, and the last column 79 provides comments. Each row of the encoded output bit stream is referenced 76–86. The basic operation for compressing the input byte stream 75 (ABAAAAAACABA) proceeds as follows. Compression is achieved by locating matching strings of bytes in the input byte stream 75. In the preferred embodiment, a shift register structure shown in FIG. 4 is utilized for performing an efficient hash search. A more detailed discussion of the structure shown in FIG. 4 and the search method will be presented shortly. When the first input byte is received by the compression unit 4 a search is performed to determine whether there were any other 2-byte strings in the shift register which match the first input byte. The first input byte is character "A" (76, FIG. 3) which has no prior entry in the shift register means and, thus, this first byte is appended to the encoded output stream after a tag bit of "0" to indicate that the 8-bit byte is "raw" (or not compressed) as shown at (76, 77, (FIG. 3). To insure that no spurious matches of input byte character "A" occur, steps are taken (as discussed below) during the initialization of the shift register.

To initialize the system in order to avoid spurious results, the shift register is cleared and a valid bit (1) is input into the array along with the input bytes. This valid bit suppresses all matches further down the shift register array.

The next input byte in the input byte stream is a "B" character. So far, the only other byte in the byte stream is non-matching (the shift register has "A") and, thus, the byte for character "B" and a "raw" byte indicator are output as shown at 78, 77 (FIG. 3). The next input byte in the input stream 75 is character "A". Because in the preferred embodiment only strings having two or more bytes are compressed, the byte for character A is left uncompressed and it is output as a raw data byte as shown at 80 (FIG. 3). However, when the next input byte (character "A") is encountered, a 2-byte string is found. Compression unit 4 sends a match of length 2 and compares the next byte of the input byte stream. Because the next input byte matches the prior bytes (e.g. character "A"), the match length is incremented and the string match is "extended". This process continues for the next 4 input bytes having character "A". As shown at row 82, FIG. 3, the encoded version of the bit string (AAAAAA) is "11 0000001 1100". The first bit of the encoded string is a 1 indicating the compressed encoding mode. The next bit in the bit string indicates that the short form of the offset is utilized (23, FIG. 2). The offset is 0000001 indicating an offset of 1 byte and the length as shown in Table 25 (FIG. 2) for "1100" is 5 bytes. The rest of the bytes in the input byte stream 75 are encoded using the same strategy as discussed above.

In the above example, if a byte did not match, then compression unit 4 would search through the shift register for a string that matched up to and included the current input byte. If such a new string was found, the match length would be incremented and the position of the new matching string within the shift register would be determined and saved; this string match has thus been "extended". If such a new string is not found, the current matching string is assumed to be the maximal string and in its encoded form or raw byte form it is output. In the encoded form, its length and position within the shift register are appended to the output (compressed) data stream. The location of the matching bit string ranges in the preferred embodiment from 1 to the memory size (("MEMSIZE")—1) of the shift register. As stated above, length and entry locations are encoded as shown in FIG. 2. Note that, in contrast to the approaches discussed in the background section of this application, the compression method of the preferred embodiment results in variable length strings mapped to variable length output codes.

Those skilled in the art will recognize that there are many implementations for performing string search operations on the input byte stream. In particular, there are many hashing techniques and search methods that could be used to find matching strings. For a complete background on various hashing techniques, refer to Knuth, Sorting and Searching, The Art of Computer Programming (Vol. 3) pp. 506-549 (1973), which is herein incorporated by reference. In commonly assigned copending application having U.S. Ser. No. 297,152 to Dr. Whiting, a detailed description of a particular hashing structure is disclosed. The data structure and approach in the application were designed to minimize the number of RAM-cycles required for the search function, and maximize the throughput of the compression system. In the preferred embodiment, a shift register array contains up to 2048 entries and discards the use of the prior methods referenced above.

Referring now to FIG. 4, the preferred embodiment of the shift register structure is now discussed. Thus, the shift register array 102 contains up to 2408 characters of previously processed input data (which has already been compressed or which is uncompressed as raw data). A data character is stored at each entry of shift register 16. When new input data is received by the compression unit 4 (FIG. 1a), the present invention checks to see if a "string" of at least 2 bytes in the new input data matches the string in the shift register 102. If so, this string of input data is encoded or, if it is not, it is represented as raw data as described above.

A more detailed discussion of FIG. 4 is now presented. Only a portion of the shift register array 102 is shown in FIG. 4. Namely, two entries HISTORY (J) 104 and HISTORY (J+1) 106 are shown. At any given time T, the contents of the JTH entry of the shift register array 102 is indicated by HISTORY [J,T] where J =1... MEMSIZE. In the preferred embodiment, the shift register array may be implemented using an actual shift register circuit or by using a modified associative memory array, etc. At the output of shift register entries 104 and 106 are comparison circuits MATCH(J) 108 and MATCH(J+1) 110. The comparison circuits (MATCH (J) where J=1... MEMSIZE) are coupled to the output of each entry of the shift register array and to a broadcast byte line 114. The input data stream which is being checked for a matching string within the shift register array is broadcast over line 114. The MATCH (J) circuit 108 compares the output of the shift register entry 104 and the input data character broadcast over line 114. If the broadcast data character is equal to the stored character at the shift register entry 104, then a bit is set to 1 at MATCH (J) circuit 108. Alternatively, if there is no match between the broadcast byte and the stored character at entry 104, then a bit is set to 0 at MATCH (J) circuit 108. The input data character is broadcast simultaneously to all of the comparison circuits (MATCH (J) where J=1... MEMSIZE). Stated differently, the operation occurs simultaneously in a pipeline fashion for all of the entries of the shift register array 102.

After a byte has been broadcast and compared at each comparison circuit (MATCH (J=1... MEMSIZE)) the byte is shifted into the first entry of the shift register array 102 and each element of the array moves over 1 such that:

HISTORY (J + 1, T + 1): = HISTORY (J,T),
        J = 1 ... MEMSIZE-1
HISTORY (1,T + 1): = BYTE processing continues with the next byte of the input data stream being broadcast over line 114 for comparison at each MATCH circuit.

Each comparison circuit MATCH (J) where J=1.. . MEMSIZE is associated with an AND gate and a flipflop. MATCH circuit 108, AND gate 118 and flipflop 122 are representative of the circuitry for the entire array. The output of the MATCH circuit 108 (bit=0,1) is input into the AND gate 118. Simultaneously input into an AND gate 118 is the output of the flipflop 122 which is representative of the prior output of the AND gate 118. If the output of the AND gate is a 1, then a match was found on the current and past comparisons of the input data. However, if the output of AND gate 118 is 0, then the input data no longer matches the contents of the shift register entry 104. The purpose of AND gate 118 and flipflop 122 are for determining when the input data stream no longer continuously matches the stored data character of the shift register entry 104.

Each flipflop of the array maintains a bit called STRING (J,T). When a new string begins, the STRING bit is set to 1 by input 116 at each flipflop throughout the array, thus: STRING (J,T): =1 where J=1... MEMSIZE is set to 1. As each new input data byte is compared at the comparison circuits, the value of string is updated as follows: STRING (J,T+1): =STRING (J,T)X MATCH (J). This operation is performed at AND gate 118. Thus, the flipflop 122 STRING bit is kept set if and only if it was set to 1 and the entry of the shift register array (HISTORY (J,T)) is equal to the input byte to cause MATCH (J) 1 to be equal.

After two input bytes have been presented to the shift register array, if all of the STRING bits are cleared (or set to 0), there are no matching strings in the array. Alternatively, if some of the STRING bits are still set (set to 1), there is at least one string match in the array. Incoming input bytes are broadcast and shifted into the array until all of the STRING bits are cleared to 0. In an alternate embodiment, a maximum number of predefined input bytes are broadcast and shifted into the array to avoid any possibility of having an infinite matching string.

The output (STRING (J), J=1... MEMSIZE) of each flipflop 118, 120 is input to a series of OR gates 128. When all of the OR gates (1-13) become 0, then there are no more matching strings in the shift register 102. A controller 130 in the form of a state machine accumulates the number of matches for each entry in the array. The controller keeps track of the string lengths of each entry of the shift register array and outputs the appropriate encoded version of the length and entry of each of the strings and/or raw data bytes.

If N bytes have been input into the shift register array, the length of the string match is the number of bytes for which string bits were set (N−1), and the offset of the string match is the entry location within the shift register array. If there is more than one matching string, then a priority encoding network will determine which matching string to pick. In the preferred embodiment the priority network returns the smallest index J for which STRING (J,T+N−1) is non-zero.

In order to perform decompression, the shift register array 102 is utilized. Under this scenario the contents of the shift register array are accessed in a random access fashion using the offset fields of the encoded strings. When a raw byte is parsed from the input compressed data stream, that byte is output to the output data stream and it is also shifted into the shift register array 102. When an encoded string is parsed, the offset is used as an "address" into the shift register and that byte is read from the shift register and then shifted into the shift register array 102. By pre-parsing the input compressed data stream and building a pipeline address lookup circuit, pipelining can be utilized to maximize throughput.

Figure 5:
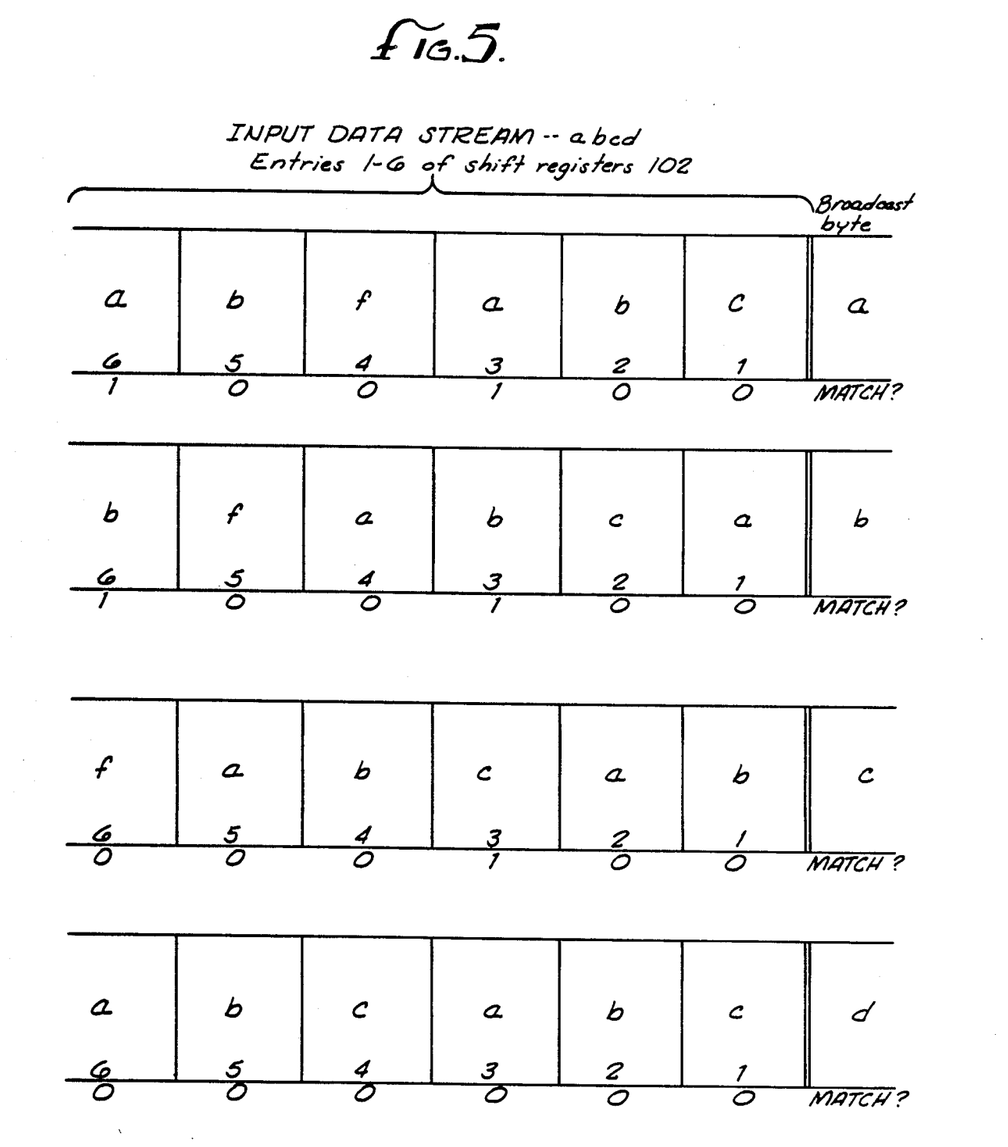
FIG. 5 is a results table depicting the search of a particular input data string within the shift register array.

Referring to FIG. 5, a result table of an encoding operation utilizing the shift register of FIG. 4 is shown. In this example, an input data stream ABCD is broadcast one character at a time into the shift register array 102. There are six pre-existing characters in the shift register entries and they are ABFABC. The first entry of the shift register array 102 is equal to C (HISTORY [1]=C). The second entry of the shift register array is B (HISTORY [2]=B). The third entry of the shift register array is A (HISTORY [3]=A). The fourth entry of the shift register array 102 is F (HISTORY [4]=F). The fifth entry of the shift register array 102 is B (HISTORY [5]=B), and the sixth entry of the shift register array 102 is A (HISTORY [6]=A). The first input byte is broadcast to an A. As a result of the comparison operation performed by the MATCH circuits, there are two matches found at shift register entries HISTORY [6] and HISTORY [3]. As a result of the comparison at HISTORY [3] and HISTORY [6], a match bit equal to 1 is output. The remaining entries have no matches and thus, the output MATCH bits a HISTORY [1], HISTORY [2], HISTORY [4] and HISTORY [5] are equal to zero. The input byte A is then shifted into the shift register array and the remaining characters are shifted to the next entry of the array. Character A now occupies the first location of the shift register array (HISTORY [1]). The next input byte broadcast is B. Once again, there are two matches found, one at shift register entry HISTORY [3] and the other at shift register entry HISTORY [6]. All other comparisons result in no matches and thus, the output MATCH bit is equal to 0 for those entries. Note that the longest matching strings occur at shift register entry HISTORY [3] and shift register entry HISTORY [6]. At this time, both have equal matching strings of equal length of two bytes. Naturally, the STRING bit is still equal to 1 for the shift register entries HISTORY [3] and HISTORY [6]. Thus, the comparison continues because the output to controller 130 still shows that matches are occurring and in this example no limit to the search has been set.

The input byte B is then shifted into the shift register array to the first location (HISTORY [1]) and the remaining characters are shifted to the next entry of the array. The next input byte to be broadcast is C. C matches at only one entry of the shift register array, HISTORY [3]. Shift register entry HISTORY [6] contains an F which does not match the broadcast byte C. Thus, the longest matching string is at shift register entry HISTORY [3]. Controller 130 maintains the accumulated string length for match results of 1 at entry shift register HISTORY [3]. Broadcast byte C is then input into the shift register array to the first location and all other bytes are shifted to the next entry in the array.

The next broadcast byte input is a D. There are no matches for input byte D. And thus, the longest matching string has been found at shift register entry HISTORY [3] having length 3 with the characters ABC. Encoding of the entry location and the length are determined by the preferred embodiment shown in FIG. 2 (11000001101).

The invention has been described in an exemplary and preferred embodiment, but is not limited thereto. Those skilled in the art will recognize that a number of additional modifications and improvements can be made to the invention without departure from the essential spirit and scope. The scope of the invention should only be limited by the appended set of claims.

We claim:

1. An apparatus for comparing an input data character with a data stream, said data stream including a plurality of data characters, said apparatus comprising:
    shift means for storing said data characters of said data stream, said shift means having a plurality of entries and each entry of said shift means for storing one of said data characters of said data stream;
    means for broadcasting said input data character to each entry of said shift means;
    means for transferring each said stored data character of each entry of said shift means to another entry of said shift means;
    for each entry of said shift means, means for comparing said stored data character of said entry with said input data character to determine whether said stored data character matches said input data character; and
    means for separately accumulating the results of said comparison for each entry of said shift means.

2. The apparatus of claim 1 further including means for storing said accumulations of results for each entry of said shift means.

3. The apparatus of claim 2 further including means for comparing said stored result of said comparison with the result of a comparison for a later input data character.

4. The apparatus of claim 1 further including means for converting a string of one or more of said input data characters into a variable length encoded data stream, said means comprising:
    means for encoding matching input data characters by assigning a tag indicating said matching input data characters were found and a substitution code including a variable length indicator of said length of said matching input data characters and a pointer indicating said entry of said shift means having at least one character of said matching input data characters;
    means for encoding the first character of said input data characters by assigning a "raw" data tag and said first character of said input data characters.

5. The apparatus of claim 4 further including means for evaluating said accumulations of comparison results to determine which of said accumulations corresponds to a longest string of said matching input data characters.

6. The apparatus of claim 4 further including means for limiting said comparison of said shift means to a predefined quantity of input data characters.

7. The apparatus of claim 6 further including means for evaluating said accumulations of comparison results to determine which of said accumulations corresponds to the longest strings of said matching input data characters, and means for prioritizing said longest strings when more than one of said longest strings have equal length.

8. The apparatus of claim 7 wherein said means for prioritizing further includes means for choosing the earliest of said longest strings.

9. The apparatus of claim 4 further including means for decoding said variable length encoded data stream, said means including:
    means for parsing said encoded data stream into separate portions, each said separate portion starting with one of said tags;
    means for evaluating said tag of said separate portion for determining whether said tag indicates said raw data tag or said tag indicates said encoded matching input data characters.

10. The apparatus of claim 9 further including:
    means for interpreting said length indicator and said pointer of said substitution code for generating said matching input data characters.

11. The apparatus of claim 9 further including:
    means for obtaining said first character of said encoded data stream.

12. A method for converting an input data character stream into a variable length encoded data stream in a data compression system, said data compression system comprising a shift means, said shift means having a plurality of entries, each entry of said shift means for storing a data character of said input data stream, said method comprising the steps of:
    performing a search in said shift means for a longest matching data string which matches said input data stream, said step of performing said search including the steps of broadcasting each of said input data character of said input data stream to each entry of said shift means, comparing each input data character simultaneously with each entry of said shift means, and inputting each input data character into said shift means, operative when said longest matching data string is found within said shift means, encoding said matching data string by assigning a tag indicating said matching data string and a string substitution code including a variable length indicator of said length of said matching data string and a pointer indicating said entry of said shift means having said matching data string, operative when said matching input data string is not found within said shift means, encoding a first character of said input data stream by assigning a "raw" data tag and said first character of said input data stream, whereby said input data stream is converted into a variable length encoded data stream.

13. The method of claim 12 wherein said of performing said search in said shift means for said longest matching data string further includes the step of limiting said search to a predefined quantity of input data characters of said input data stream.

14. The method of claim 12 further including the steps of:

discarding input data characters of said input data stream which have been encoded and further encoding said input data stream.

15. The method of claim 12 wherein said step of assigning said pointer and said length indicator further includes the step of representing said pointer and said length indicator by an encoding scheme which ensures that a matching string of two characters of said input data stream is compressed to less than said two characters of said input data stream.

16. The method of claim 12 further including the step of decoding said variable length encoded data stream, said step including the steps of:

parsing said variable length encoded data stream into separate portions, each said separate portion starting with one of said tags, evaluating tags of said separate portions for determining whether any of said tags is said raw data tag or said tag indicating said encoded matching data string.

17. The method of claim 16 further including the step:

operative when said tag indicates said encoded matching string, interpreting said length indicator and said pointer of said substitution code for generating said matching data string, thereby reconstructing a portion of the original input data stream.

18. The method of claim 16 further including the step:

operative when said tag indicates said raw data tag, obtaining said first character of said encoded input data stream, thereby reconstructing a portion of the original input data stream.

19. An apparatus for converting an input data character stream into a variable length encoded data stream in a data compression system, said data compression system comprising a shift means, said shift means having a plurality of entries, each entry of said shift means for storing a data character of said input data stream, said apparatus comprising:

means for performing a search in said shift means for a longest matching data string which matches said input data stream, said means for performing said search including means for broadcasting each said data character of said input data stream to each said entry of said shift means, and means for comparing each said input data stream simultaneously with each entry of said shift means, means for encoding said matching data string by assigning a tag indicating said matching data string and a string substitution code including a variable length indicator of the length of said matching data string and a pointer indicating the entry of said shift of said matching data string, means for encoding a first character of said input data stream by assigning a "raw" data tag and said first character of said input data stream, whereby said input data stream is converted into a variable length encoded data stream.

20. The apparatus of claim 19 wherein said means for performing said search in said shift means for said longest matching data string further includes means for limiting said search to a predefined quantity of input data characters of said input data stream.

21. The apparatus of claim 19 further including:

means for discarding input data characters of said input data stream which have been encoded.

22. The apparatus of claim 19 wherein said means for assigning said pointer and said length indicator further includes means for representing said pointer and said length indicator by an encoding scheme which ensures that a matching string of two characters of said input data stream is compressed to less than said two characters of said input data stream.

23. The apparatus of claim 19 further including means for decoding said variable length encoded data stream, said means including:

means for parsing said variable length encoded data stream into separate portions, each said separate portion starting with one of said tags, means for evaluating each said tag of said separate portions for determining whether each said tag is said raw data tag or said tag indicating said encoded matching data string.

24. The apparatus of claim 23 further including:

means for interpreting said length indicator and said pointer of said substitution code for generating said matching data string, thereby reconstructing a portion of the original input data stream.

25. The apparatus of claim 23 further including:

means for obtaining said first character of said encoded input data stream, thereby reconstructing a portion of the original input data stream.

26. A method for comparing an input data character with a data stream, said data stream including a plurality of data characters, said method comprising the steps of:

storing said data characters of said data stream in a shift means, said shift means having a plurality of entries and each entry of said shift means for storing one of said data characters of said data stream;

broadcasting said input data character to each entry of said shift means;

transferring each said stored data character of each entry of said shift means to another entry of said shift means;

for each entry of said shift means, comparing said stored data character of said entry with said input data character to determine whether said stored data character matches said input data character; and separately accumulating the results of said comparison for each entry of said shift means.

27. The method of claim 26 further including the step of storing said accumulations of results for each entry of said shift means.

28. The method of claim 27 further including the step of comparing said stored result of said comparison with the result of a comparison for a later input data character.

29. The method of claim 26 further including the step of converting a string of one or more of said input data characters into a variable length encoded data stream, said converting step comprising the steps of:

operative when matching input data characters are found within said shift means, encoding said matching input data characters by assigning a tag indicating said matching input data characters were found and a substitution code including a variable length indicator of said length of said matching input data characters and a pointer indicating said entry of said shift means having at least one character of said matching input data characters;

operative when said matching input data characters are not found within said shift means, encoding the first character of said input data characters by assigning a "raw" data tag and said first character of said input data characters;

whereby said data stream is converted into said variable length encoded data stream.

30. The method of claim 29 further including the step of evaluating said accumulations of comparison results to determine which of said accumulations corresponds to a longest string of said matching input data characters.

31. The method of claim 29 further including the step of limiting said comparison of said shift means to a predefined quantity of input data characters.

32. The method of claim 31 further including the steps of evaluating said accumulations of comparison results to determine which of said accumulations corresponds to the longest strings of said matching input data characters, and prioritizing said longest strings when more than one of said longest strings have equal length.

33. The method of claim 32 wherein said step of prioritizing further includes the step of choosing the earliest of said longest strings.

34. The method of claim 29 further including the step of decoding said variable length encoded data stream, said step including the steps of:

parsing said encoded data stream into separate portions, each said separate portion starting with one of said tags;

evaluating said tag of said separate portion for determining whether said tag indicates said raw data tag or said tag indicates said encoded matching input data characters.

35. The method of claim 34 further comprising the steps of:

operative when said tag indicates said encoded matching input data characters, interpreting said length indicator and said pointer of said substitution code for generating said matching input data characters, thereby reconstructing a portion of the original data stream.

36. The method of claim 34 further including the step of:

operative when said tag indicates said raw data tag, obtaining said first character of said encoded data stream, thereby reconstructing a portion of the original data stream.

37. A method for converting a variable length encoded data stream into an output data character stream in a data decompression system, said data decompression system comprising a shift means, said shift means having a plurality of entries, each entry of said shift means for storing a data character of said output data character stream, said method comprising the steps of:

parsing said variable length encoded input data stream into separate portions, each said separate portion starting with a tag, evaluating said tag of each said separate portion for determining whether said tag is a raw data tag or a tag indicating an encoded matching data string, operative when said tag is said raw data tag, parsing a raw data byte from said separate portion, outputting said raw data byte, placing said raw data byte in said shift means, and operative when said tag is said tag indicating an encoded matching data string, parsing a variable length indicator of the length of said matching data string and an offset indicating an entry within said shift means containing the first character of said matching data string, outputting said matching data string at said entry within said shift means for said length, and placing said matching data string in said shift means.

38. An apparatus for converting a variable length encoded data stream into an output data character stream in a data decompression system, said data decompression system comprising a shift means, said shift means having a plurality of entries, each entry of said shift means for storing a data character of said output data character stream, said apparatus comprising:

means for parsing said variable length encoded input data stream into separate portions, each said separate portion starting with a tag, means for evaluating said tag of each said separate portion for determining whether said tag is a raw data tag or a tag indicating an encoded matching data string, means for parsing a raw data byte from said separate portion, means for outputting said raw data byte, means for placing said raw data byte in said shift means, and means for parsing a variable length indicator of the length of said matching data string and an offset indicating an entry within said shift means containing the first character of said matching data string, means for outputting said matching data string at said entry within said shift means for said length, and means for placing said matching data string in said shift means.

39. An apparatus for comparing an input data character with a data stream, said data stream including a plurality of data characters, said apparatus comprising:

means for storing said data characters of said data stream, said storage means having a plurality of entries and each entry of said storage means for storing one of said data characters of said data stream;

means for broadcasting said input data character to each entry of said storage means;

for each entry of said storage means, means for comparing said stored data character of said entry with said input data character to determine whether said stored data character matches said input data character; and means for separately accumulating the results of said comparison for each entry of said storage means.

40. The apparatus of claim 39 further including means for storing said accumulations of results for each entry of said storage means.

41. The apparatus of claim 40 further including means for comparing said stored result of said comparison with the result of a comparison for a later input data character.

42. The apparatus of claim 39 further including means for converting a string of one or more of said input data characters into a variable length encoded data stream, said means comprising:

means for encoding matching input data characters by assigning a tag indicating said matching input data characters were found and a substitution code including a variable length indicator of said length of said matching input data characters and a pointer indicating said entry of said storage means having at least one character of said matching input data characters;

means for encoding the first character of said input data characters by assigning a "raw" data tag and said first character of said input data characters.

43. The apparatus of claim 42 further including means for evaluating said accumulations of comparison results to determine which of said accumulations corresponds to a longest string of said matching input data characters.

44. The apparatus of claim 42 further including means for limiting said comparison of said storage means to a predefined quantity of input data characters.

45. The apparatus of claim 44 further including means for evaluating said accumulations of comparison results to determine which of said accumulations corresponds to the longest strings of said matching input data characters, and means for prioritizing said longest strings when more than one of said longest strings have equal length.

46. The apparatus of claim 45 wherein said means for prioritizing further includes means for choosing the earliest of said longest strings.

47. The apparatus of claim 42 further including means for decoding said variable length encoded data stream, said means including:

means for parsing said encoded data stream into separate portions, each said separate portion starting with one of said tags;

means for evaluating said tag of said separate portion for determining whether said tag indicates said raw data tag or said tag indicates said encoded matching input data characters.

48. The apparatus of claim 42 further including:

means for interpreting said length indicator and said pointer of said substitution code for generating said matching input data characters.

49. The apparatus of claim 47 further including:

means for obtaining said first character of said encoded data stream.

50. A method for comparing an input data character with a data stream, said data stream including a plurality of data characters, said method comprising the steps of:

storing said data characters of said data stream in a storage means, said storage means having a plurality of entries and each entry of said storage means for storing one of said data characters of said data stream;

broadcasting said input data character to each entry of said storage means;

for each entry of said storage means, comparing said stored data character of said entry with said input data character to determine whether said stored data character matches said input data character; and separately accumulating the results of said comparison for each entry of said storage means.

51. The method of claim 50 further including the step for storing said accumulations of results for each entry of said storage means.

52. The method of claim 51 further including the step of comparing said stored result of said comparison with the result of a comparison for a later input data character.

53. The method of claim 50 further including the step of converting a string of one or more of said input data characters into a variable length encoded data stream, said converting step comprising the steps of:

operative when matching input data characters are found within said storage means, encoding said matching input data characters by assigning a tag indicating said matching input data characters were found and a substitution code including a variable length indicator of said length of said matching input data characters and a pointer indicating said entry of said storage means having at least one character of said matching input data characters;

operative when said matching input data characters are not found within said storage means, encoding the first character of said input data characters by assigning a "raw" data tag and said first character of said input data characters;

whereby said data stream is converted into said variable length encoded data stream.

54. The method of claim 53 further including the step of evaluating said accumulations of comparison results to determine which of said accumulations corresponds to a longest string of said matching input data characters.

55. The method of claim 53 further including the step of limiting said comparison of said storage means to a predefined quantity of input data characters.

56. The method of claim 55 further including the steps of evaluating said accumulations of comparison results to determine which of said accumulations corresponds to the longest strings of said matching input data characters, and prioritizing said longest strings when more than one of said longest strings have equal length.

57. THe method of claim 56 wherein said step of prioritizing further includes the step of choosing the earliest of said longest strings.

58. The method of claim 53 further including the step of decoding said variable length encoded data stream, said step including the steps of:

parsing said encoded data stream into separate portions, each said separate portion starting with one of said tags;

evaluating said tag of said separate portion for determining whether said tag indicates said raw data tag or said tag indicates said encoded matching input data characters.

59. The method of claim 58 further comprising the steps of:

operative when said tag indicates said encoded matching input data characters, interpreting said length indicator and said pointer of said substitution code for generating said matching input data characters, thereby reconstructing a portion of the original data stream.

60. The method of claim 58 further including the step of:

operative when said tag includes said raw data tag, obtaining said first character of said encoded data stream, thereby reconstructing a portion of the original data stream.

* * * * *

UNITED STATES PATENT AND TRADEMARK OFFICE
CERTIFICATE OF CORRECTION

PATENT NO. : 5,003,307

DATED : March 26, 1991

INVENTOR(S) : Douglas L. Whiting and Glen A. George

It is certified that error appears in the above-identified patent and that said Letters Patent is hereby corrected as shown below:

On the Title page, item [63], and at col. 1, line 11, "Pat. No. 4,841,092" to --Pat. No. 4,016,009--.

Col. 3, line 66, cancel "in" and insert --via--

Col. 8, line 46, after "1a" insert --,--
      line 47, beginning of line cancel ","

Col. 9, line 49, after "3)" insert --)--.

Col. 15, claim 13, line 18, after "said" and before "of" insert --step--.

Col. 20, claim 57, line 54, cancel "THe" and insert --The--.

Signed and Sealed this

Thirty-first Day of August, 1993

*Attest:*

BRUCE LEHMAN

*Attesting Officer*   *Commissioner of Patents and Trademarks*